(12) United States Patent
Yoon (10) Patent No.: US 9,196,328 B2
(45) Date of Patent: Nov. 24, 2015

(54) SEMICONDUCTOR MEMORY APPARATUS AND OPERATION METHOD USING THE SAME

(71) Applicant: SK hynix Inc., Icheon-si Gyeonggi-do (KR)

(72) Inventor: Jung Hyuk Yoon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 123 days.

(21) Appl. No.: 14/022,759

(22) Filed: Sep. 10, 2013

(65) Prior Publication Data
US 2014/0301148 A1  Oct. 9, 2014

(30) Foreign Application Priority Data

Apr. 8, 2013 (KR) .......................... 10-2013-0038035

(51) Int. Cl.
*G11C 7/10* (2006.01)
*G11C 7/22* (2006.01)
*G11C 13/00* (2006.01)

(52) U.S. Cl.
CPC .............. *G11C 7/22* (2013.01); *G11C 13/0002* (2013.01); *G11C 13/004* (2013.01); *G11C 13/0038* (2013.01); *G11C 13/0061* (2013.01); *G11C 13/0069* (2013.01)

(58) Field of Classification Search
USPC ........................................ 365/189.03, 189.07
See application file for complete search history.

(56) References Cited

U.S. PATENT DOCUMENTS

| | | | | |
|---|---|---|---|---|
| 5,034,922 A | * | 7/1991 | Burgess | 365/189.07 |
| 5,781,031 A | * | 7/1998 | Bertin et al. | 326/39 |
| 6,385,112 B1 | * | 5/2002 | Kurosaki | 365/185.33 |
| 6,940,744 B2 | * | 9/2005 | Rinerson et al. | 365/148 |
| 7,046,566 B1 | * | 5/2006 | Choe et al. | 365/203 |

FOREIGN PATENT DOCUMENTS

| | | |
|---|---|---|
| KR | 1020080054374 A | 6/2008 |
| KR | 1020100022784 A | 3/2010 |

* cited by examiner

*Primary Examiner* — Pho M Luu
(74) *Attorney, Agent, or Firm* — William Park & Associates Ltd.

(57) ABSTRACT

A semiconductor memory apparatus includes a command processing block configured to generate a voltage generation start signal, a first write control signal, a second write control signal, a read signal, and an operation signal in response to a first control signal and a second control signal in a write operation, and a memory control block configured to electrically couple a memory block, which stores data, to a sense amplifier or apply a predetermined voltage to the memory block in response to the voltage generation start signal, the first write control signal, the second write control signal, the read signal, and the operation signal.

24 Claims, 4 Drawing Sheets

SEMICONDUCTOR MEMORY APPARATUS AND OPERATION METHOD USING THE SAME

CROSS-REFERENCES TO RELATED APPLICATION

The present application claims priority under 35 U.S.C. §119(a) to Korean application number 10-2013-0038035, filed on Apr. 8, 2013, in the Korean Intellectual Property Office, which is incorporated herein by reference in its entirety as set forth in full.

BACKGROUND

1. Technical Field

Various embodiments generally relate to a semiconductor integrated circuit, and more particularly, to a semiconductor memory apparatus and an operation method using the same.

2. Related Art

A semiconductor memory apparatus stores data and outputs the stored data.

In more detail, a general semiconductor memory apparatus stores data in response to a command from a controller or a central processing unit, and outputs the stored data.

Figure 1:
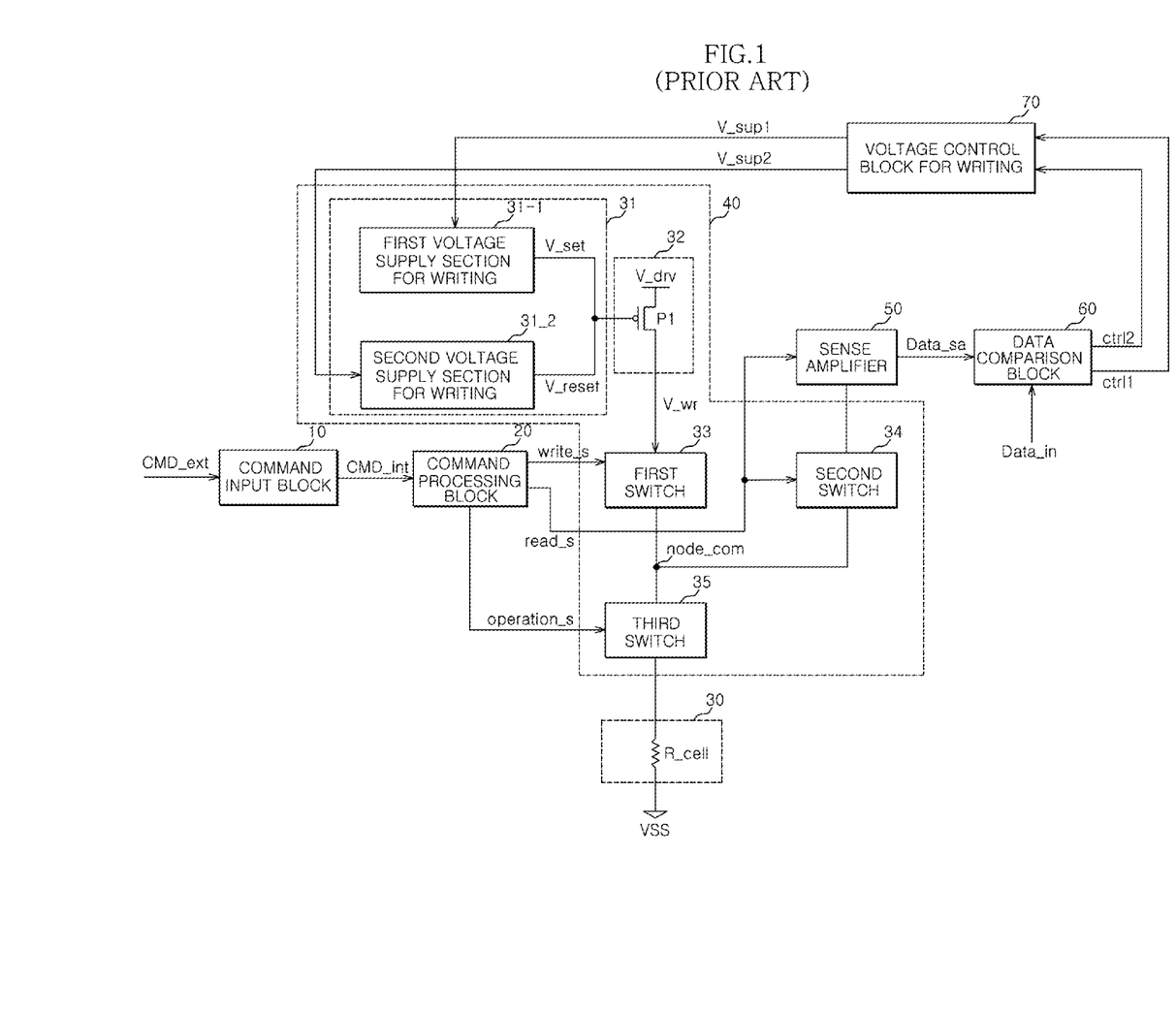
FIG. 1 is a configuration diagram of a general semiconductor memory apparatus.

As illustrated in FIG. 1, the general semiconductor memory apparatus includes a command input block 10, a command processing block 20, a memory block 30, a memory control block 40, a sense amplifier 50, a data comparison block 60, and a voltage control block 70 for writing.

The command input block 10 may convert an external command CMD_ext input from an exterior to an internal command CMD_int.

The command processing block 20 decodes the internal command CMD_int, and enables a read signal read_s when the internal command CMD_int is determined as a read command. When the internal command CMD_int is determined as a write command, the command processing block 20 enables the read signal read_s for a predetermined time, and enables a write signal write_s when the read signal read_s is disabled. When one of the read signal read_s and the write signal write_s is enabled, the command processing block 20 enables an operation signal operation_s.

The memory block 30 stores data. For example, the memory block 30 includes a resistive memory element R_cell having a resistance value varying according to the level of an applied voltage or the amount of an applied current. The memory control block 40 is electrically coupled to a first end of the resistive memory element R_cell, and a ground terminal VSS is electrically coupled to a second end of the resistive memory element R_cell, the first end facing the second end.

The memory control block 40 allows a predetermined amount of current to flow through the memory block 30 or applies a voltage having a specific level to the memory block 30 in response to first and second voltage supply control signals V_sup1 and V_sup2, the write signal write_s, the read signal read_s, and the operation signal operation_s. The memory control block 40 electrically couples the memory block 30 to the sense amplifier 50. For example, when the write signal write_s is enabled, the memory control block 40 supplies the memory block 30 with a predetermined voltage or a predetermined amount of current in response to the first and second voltage supply control signals V_sup1 and V_sup2. When the read signal read_s is enabled, the memory control block 40 electrically couples the sense amplifier 50 to the memory block 30.

The memory control block 40 includes a voltage supply selection unit 31, a memory voltage supply unit 32, and first to third switches 33, 34, and 35.

The voltage supply selection unit 31 provides the voltage supply unit 32 with a first voltage V_set for writing and a second voltage V_reset for writing in response to the first and second voltage supply control signals V_sup1 and V_sup2. For example, the voltage supply selection unit 31 supplies the voltage supply unit 32 with one of the first voltage V_set for writing and the second voltage V_reset for writing in response to the first and second voltage supply control signals V_sup1 and V_sup2. The voltage supply selection unit 31 does not supply the voltage supply unit 32 with both of the first voltage V_set for writing and the second voltage V_reset for writing in response to the first and second voltage supply control signals V_sup1 and V_sup2.

The voltage supply selection unit 31 includes a first voltage supply section 31-1 for writing and a second voltage supply section 31-2 for writing.

The first voltage supply section 31-1 for writing is activated in response to the first voltage supply control signal V_sup1, and the activated first voltage supply section 31-1 for writing generates the first voltage V_set for writing. The deactivated first voltage supply section 31-1 for writing does not generate the first voltage V_set for writing.

The second voltage supply section 31-2 for writing is activated in response to the second voltage supply control signal V_sup2, and the activated second voltage supply section 31-2 for writing generates the second voltage V_reset for writing. The deactivated second voltage supply section 31-2 for writing does not generate the second voltage V_reset for writing.

The voltage supply unit 32 generates a memory voltage V_wr in response to one voltage level of the first and second voltages V_set and V_reset. For example, the voltage supply unit 32 generates a memory voltage V_wr having a first voltage level when the first voltage V_set for writing is applied, and generates a memory voltage V_wr having a second voltage level when the second voltage V_reset for writing is applied.

The voltage supply unit 32 includes a transistor P1. The transistor P has a gate, which is electrically coupled to a node electrically coupled to the output terminals of the first voltage supply section 31-1 for writing and the second voltage supply section 31-2 for writing, a source that receives a driving voltage V_drv, and a drain that outputs the memory voltage V_wr.

The first switch 33 transfers the memory voltage V_wr to a common node Node_com in response to the write signal write_s. For example, when the write signal write_s is enabled, the first switch 33 transfers the memory voltage V_wr to the common node Node_com.

The second switch 34 electrically couples the sense amplifier 50 to the common node Node_com in response to the read signal read_s. For example, when the read signal read_s is enabled, the second switch 34 electrically couples the sense amplifier 50 to the common node Node_com.

The third switch 35 electrically couples the common node Node_com to the memory block 30 in response to the operation signal operation_s. For example, when the operation signal operation_s is enabled, the third switch 35 electrically couples the common node Node_com to the memory block 30. That is, when the operation signal operation_s is enabled, the third switch 35 electrically couples the common node Node_com to the resistive memory element R_cell.

When the read signal read_s is enabled and the sense amplifier 50 is electrically coupled to the memory block 30, the sense amplifier 50 determines data stored in the memory block 30 and generates storage data Data_sa. For example, when the read signal read_s is enabled, the sense amplifier 50 determines a resistance value of the memory block 30 and generates the storage data Data_sa.

The data comparison block 60 compares input data Data_in input from an exterior with the storage data Data_sa, and generates first and second control signals ctrl1 and ctrl2. For example, when the input data Data_in is substantially equal to the storage data Data_sa, the data comparison block 60 disables the first and second control signals ctrl1 and ctrl2. When the input data Data_in is different from the storage data Data_sa, the data comparison block 60 enables one of the first and second control signals ctrl1 and ctrl2. When the input data Data_in is different from the storage data Data_sa, the data comparison block 60 enables one of the first and second control signals ctrl1 and ctrl2 according to a data value of the input data Data_in.

The voltage control block 70 for writing generates the first and second voltage supply control signals V_sup1 and V_sup2 in response to the first and second control signals ctrl1 and ctrl2. For example, when the first and second control signals ctrl1 and ctrl2 are disabled, the voltage control block 70 for writing disables the first and second voltage supply control signals V_sup1 and V_sup2. When the first control signal ctrl1 of the first and second control signals ctrl1 and ctrl2 is enabled, the voltage control block 70 for writing enables the first voltage supply control signal V_sup1. When the second control signal ctrl2 of the first and second control signals ctrl1 and ctrl2 is enabled, the voltage control block 70 for writing enables the second voltage supply control signal V_sup2.

The general semiconductor memory apparatus configured as above operates as follows.

In a read operation, the external command CMD_ext is converted to the internal command CMD_int, so that the command processing block 20 enables the read signal read_s.

The memory block 30 is electrically coupled to the sense amplifier 50 through the second and third switches 34, and 35.

The sense amplifier 50 determines a data value of the memory block 30 to generate the storage data Data_sa. At this time, in the read operation, the storage data Data_sa is output to an exterior through a data output circuit (not illustrated).

In a write operation, the external command CMD_ext is converted to the internal command CMD_int and is input to the command processing block 20. The command processing block 20 enables the read signal read_s for a predetermines, disables the read signal read_s, and enables the write signal write_s after the read signal read_s is disabled.

In the write operation, when the read signal read_s is enabled, the semiconductor memory apparatus performs a preliminary read operation. Hereinafter, the preliminary read operation will be described.

When the read signal read_s is enabled, the memory block 30 is electrically coupled to the sense amplifier 50 through the second and third switches 34, and 35. The sense amplifier 50 determines the data value of the memory block 30 to generate the storage data Data_sa. An operation for generating the storage data Data_sa according to the read signal read_s that is enabled in the write operation will be referred to as the preliminary read operation. Hereinafter, an operation subsequent to the preliminary read operation will be described.

In the write operation, the data comparison block 60 compares the input data Data_in input from an exterior with the storage data Data_sa, and generates the first and second control signals ctrl1 and ctrl2. When the input data Data_in is substantially equal to the storage data Data_sa, the data comparison block 60 disables the first and second control signals ctrl1 and ctrl2. When the input data Data_in is different from the storage data Data_sa, the data comparison block 60 enables one of the first and second control signals ctrl1 and ctrl2 according to the data value of the input data Data_in. For example, when the input data Data_in is different from the storage data Data_sa and the data value of the input data Data_in is at a high level, the data comparison block 60 enables the first control signal ctrl1. When the input data Data_in is different from the storage data Data_sa and the data value of the input data Data_in is at a low level, the data comparison block 60 enables the second control signal ctrl2.

The voltage control block 70 for writing disables the first and second voltage supply control signals V_sup1 and V_sup2 when the first and second control signals ctrl1 and ctrl2 are disabled. When the first control signal ctrl1 is enabled, the voltage control block 70 for writing enables the first voltage supply control signal V_sup1. When the second control signal ctrl2, is enabled, the voltage control block 70 for writing enables the second voltage supply control signal V_sup2.

The first voltage supply section 31-1 for writing provides the first voltage V_set for writing to the memory voltage supply unit 32 when the first voltage supply control signal V_sup1 is enabled.

The second voltage supply section 31-2 for writing provides the second voltage V_reset for writing to the memory voltage supply unit 32 when the second voltage supply control signal V_sup2 is enabled.

The memory voltage supply unit 32 generates the memory voltage V_wr in correspondence with one voltage level of the first and second voltages V_set and V_reset for writing.

The memory voltage V_wr is applied to the memory block 30 through the first and third switch 33 and 35 turned on by the write signal write_s.

The memory block 30 decides a data valve according to a voltage level of the memory voltage V_wr and stores the decided data value. For example, the resistive memory element R_cell included in the memory block 30 has a resistance value varying according to the voltage level of the memory voltage V_wr.

The general semiconductor memory apparatus stores data as described above and outputs the stored data.

When the stored data is substantially equal to data input from an exterior, that is, data to be stored, the general semiconductor memory apparatus has only to maintain the stored data. However, when the stored data is different from the data to be stored, the general semiconductor memory apparatus activates one of the first and second voltage supply sections 31-1 and 31-2 for writing according to a data value of the data to be stored. A memory voltage V_wr having a voltage level corresponding to a level of a voltage output from the activated voltage supply section for writing is applied to the memory block 30, so that data is stored in the memory block 30. At this time, when the stored data is different from the data to be stored, one of the first and second voltage supply sections 31-1 and 31-2 for writing is activated according to the data value of the data to be stored. Immediately after being activated, the voltage supply section 31-1 or 31-2 for writing does not generate the voltage V_set or V_reset for writing at its own target level. That is, after the first and second voltage supply sections 31-1 and 31-2 for writing are activated and a predetermined time passes, the first and second voltage supply sections 31-1 and 31-2 for writing generate the first and second voltage V_set and V_reset for writing at their own target levels. Therefore, since the memory voltage V_wr generated according to the voltage levels of the first and second voltage V_set and V_reset for writing are also not generated at a normal voltage level, the memory block 30 storing data by the memory voltage V_wr does not normally store data. In brief, until one of the first and second voltage supply sections 31-1 and 31-2 for writing is activated and generates the first or second voltage V_set or V_reset for writing at its own target level, the memory block 30 does not store normal data. Therefore, in the write operation, until the first and second voltage supply sections 31-1 and 31-2 for writing generate the first and second voltage V_set and V_reset for writing at their own target levels, since the general semiconductor memory apparatus is not able to complete the write operation, a completion time of the write operation becomes to long.

SUMMARY

In an embodiment of the present invention, a semiconductor memory apparatus includes: a command processing block configured to generate a voltage generation start signal, a first write control signal, a second write control signal, a read signal, and an operation signal in response to a first control signal and a second control signal in a write operation; and a memory control block configured to electrically couple a memory block, which stores data, to a sense amplifier or apply a predetermined voltage to the memory block in response to the voltage generation start signal, the first write control signal, the second write control signal, the read signal, and the operation signal.

In an embodiment of the present invention, a semiconductor memory apparatus includes: a memory block configured to store data according to a voltage level of a memory voltage; a voltage supply unit configured to generate the memory voltage when an external command is a write command, and apply the memory voltage to the memory block in response to a control signal; and a data comparison block configured to compare data input from an exterior with storage data, and generate the control signal.

In an embodiment of the present invention, an operation method of a semiconductor memory apparatus includes: a step of comparing stored data with input data to generate a control signal and simultaneously generating a memory voltage in a write operation; and a step of applying the memory voltage to the memory block in response to the control signal, and storing data in the memory block.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus and an operation method using the same according to the present invention will be described in detail with reference to the accompanying drawings through an various embodiments.

Figure 2:
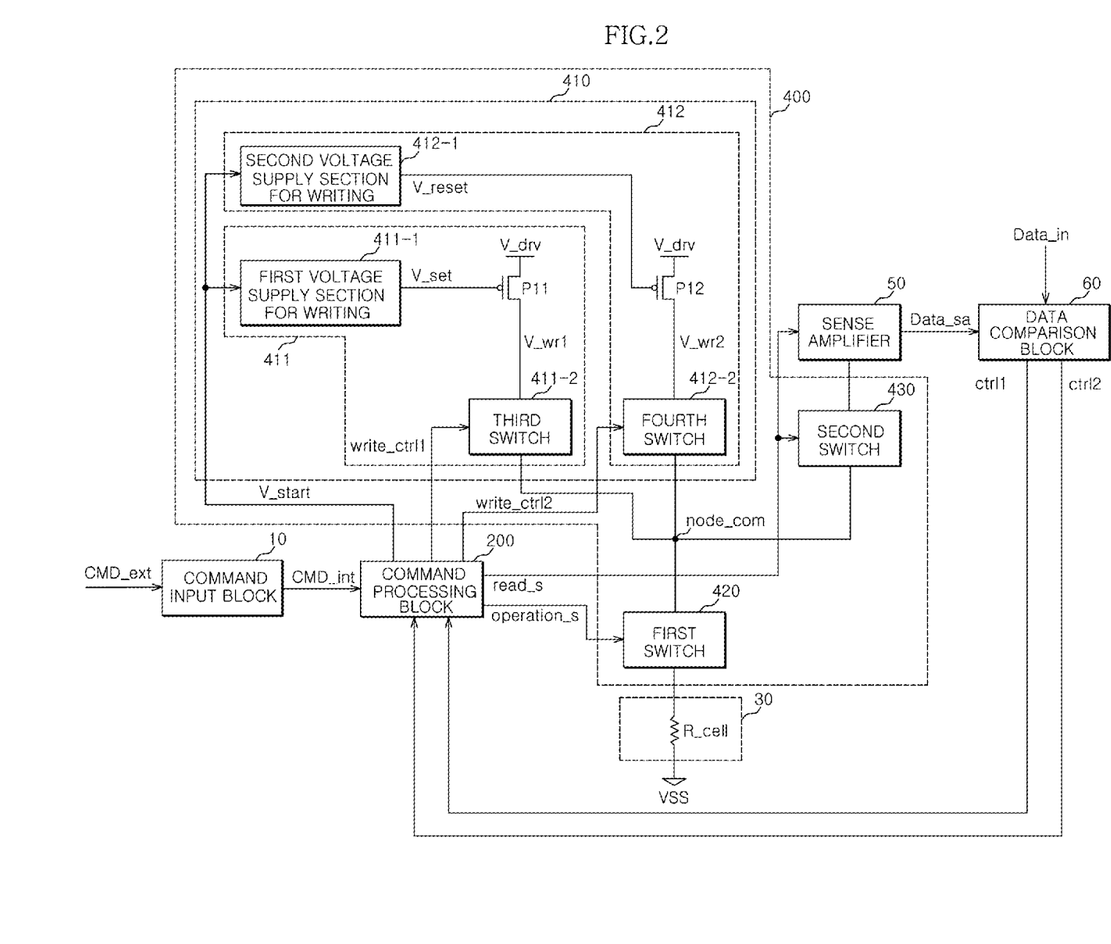
FIG. 2 is a configuration diagram of a semiconductor memory apparatus according to an embodiment.

As illustrated in FIG. 2, the semiconductor memory apparatus according to the embodiments may include a command input block 10, a command processing block 200, a memory block 30, a memory control block 400, a sense amplifier 50, and a data comparison block 60.

The command input block 10 converts an external command CMD_ext input from an exterior to an internal command CMD_int.

The command processing block 200 is configured to decide whether the semiconductor memory apparatus performs a write operation or a read operation in response to the internal command CMD_int, and to perform a decided operation.

The command processing block 200 generates a voltage generation start signal V_start, first and second write control signals write_ctrl1 and write_ctrl2, a read signal read_s, and an operation signal operation_s in response to the internal command CMD_int and first and second control signals ctrl1 and ctrl2. For example, when the internal command CMD_int is a read command, the command processing block 200 enables the read signal read_s. When the internal command CMD_int is a write command, the command processing block 200 enables the voltage generation start signal V_start, and selectively enables the first and second write control signals write_ctrl1 and write_ctrl2 in response to the first and second control signals ctrl1 and ctrl2. At this time, when one of the read signal read_s and the voltage generation start signal V_start is enabled, the command processing block 200 enables the operation signal operation_s. In more detail, when the command processing block 200 decodes the internal command CMD_int and determines the internal command CMD_int as the read command, the command processing block 200 enables the read signal read_s. When the command processing block 200 decodes the internal command CMD_int and determines the internal command CMD_int as the write command, the command processing block 200 enables the read signal read_s for a predetermined time, and selectively enables the first and second write control signals write_ctrl1 and write_ctrl2 in response to the first and second control signals ctrl1 and ctrl2 when the read signal read_s is disabled. At this time, when the internal command CMD_int is determined as the write command, the command processing block 200 generates the voltage generation start signal V_start that is generated simultaneously to the read signal read_s. Furthermore, when one of the voltage generation start signal V_start and the read signal read_s is enabled, the command processing block 200 enables the operation signal operation_s.

The memory block 30 may be configured to store data. For example, the memory block 30 decides a level of data to be stored according to a level of an applied voltage or an amount of an applied current, and stores the decided data level. Additionally, the memory block 30 may include a resistive memory element R_cell, wherein the resistive memory element R_cell has a resistance value varying according to the level of the applied voltage or the amount of the applied current. The resistance value of the resistive memory element R_cell varies according to a voltage that is applied from the memory control block 400. The memory control block 400 may be electrically coupled to a first end of the resistive memory element R_cell, and a ground terminal VSS may be electrically coupled to a second end of the resistive memory element R_cell, the first end facing the second end.

The memory control block 400 electrically couples the memory block 30 to the sense amplifier 50 or applies a voltage having a predetermined voltage level to the memory block 30 in response to the voltage generation start signal V_start, the first and second write control signals write_ctrl1 and write_ctrl2, the read signal read_s, and the operation signal operation_s. For example, when the voltage generation start signal V_start is enabled, the memory control block 400 starts to generate the voltage having a predetermined voltage level, and applies the generated voltage having a predetermined voltage level to the memory block 30 in response to the first and second write control signals write_ctrl1 and write_ctrl2. Additionally, when the voltage generation start signal V_start is enabled, the memory control block 400 generates two voltages having different voltage levels, and applies one of the two voltages to the memory block 30 in response to the first and second write control signals write_ctrl1 and write_ctrl2. Furthermore, when the read signal read_s is enabled, the memory control block 400 electrically couples the memory block 30 to the sense amplifier 50. At this time, when one of the voltage generation start signal V_start and the read signal read_s is enabled, the memory control block 400 enables the operation signal operation_s.

The memory control block 400 may include a voltage supply unit 410, and first and second switches 420 and 430.

The voltage supply unit 410 may start voltage generation in response to the voltage generation start signal V_start, and apply the predetermined voltage to a common node Node_com in response to the first and second write control signals write_ctrl1 and write_ctrl2.

The voltage supply unit 410 may include first and second memory voltage applying sections 411 and 412.

The first memory voltage applying section 411 may generate a first voltage V_set for writing when the voltage generation start signal V_start is enabled, and apply a first memory voltage V_wr1 having a voltage level corresponding to a voltage level of the first voltage V_set for writing to the common node Node_com when the first write control signal write_ctrl1 is enabled.

The first memory voltage applying section 411 may include a first voltage supply part 411-1 for writing, a first transistor P11 for voltage generation, and a third switch 411-2.

The first voltage supply part 411-1 for writing may be activated when the voltage generation start signal V_start is enabled, and may generate the first voltage V_set for writing.

The first transistor P11 for voltage generation generates the first memory voltage V_wr1 in correspondence with a voltage level of the first voltage V_set for writing. For example, the first transistor P11 for voltage generation receives the first voltage V_set for writing through a gate thereof, receives a driving voltage V_dry through a source thereof, and outputs the first memory voltage V_wr1 through a drain thereof.

The third switch 411-2 electrically couples the drain of the first transistor P11 for voltage generation to the common node Node_com when the first write control signal write_ctrl1 is enabled. That is, when the first write control signal write_ctrl1 is enabled, the third switch 411-2 applies the first memory voltage V_wr1 to the common node Node_com.

The second memory voltage applying section 412 may generate a second voltage V_reset for writing when the voltage generation start signal V_start is enabled, and apply a second memory voltage V_wr2 having a voltage level corresponding to a voltage level of the second voltage V_reset for writing to the common node Node_com when the second write control signal write_ctrl2 is enabled.

The second memory voltage applying section 412 may include a second voltage supply part 412-1 for writing, a second transistor P12 for voltage generation, and a fourth switch 412-2.

The second voltage supply part 412-1 for writing may be activated when the voltage generation start signal V_start is enabled, and may generate the second voltage V_reset for writing.

The second transistor P12 for voltage generation generates the second memory voltage V_wr2 in correspondence with a voltage level of the second voltage V_reset for writing. For example, the second transistor P12 for voltage generation receives the second voltage V_set for writing through a gate thereof, receives the driving voltage V_dry through a source thereof, and outputs the second memory voltage V_wr2 through a drain thereof.

The fourth switch 412-2 electrically couples the drain of the second transistor P12 for voltage generation to the common node Node_com when the second write control signal write_ctrl2 is enabled. That is, when the second write control signal write_ctrl2 is enabled, the fourth switch 412-2 applies the second memory voltage V_wr2 to the common node Node_com.

The first switch 420 electrically couples the common node Node_com to the memory block 30 when the operation signal operation_s is enabled. That is, when the operation signal operation_s is enabled, the first switch 420 electrically couples the common node Node_com to the resistive memory element R_cell.

The second switch 430 electrically couples the sense amplifier 50 to the common node Node_com when the read signal read_s is enabled.

The sense amplifier 50 is activated in response to the read signal read_s, and generates storage data Data_sa in response to data stored in the memory block 30. That is, the sense amplifier 50 is activated when the read signal read_s is enabled, and is electrically coupled to the memory block 30 through the first and second switches 420 and 430. At this time, the activated sense amplifier 50 determines a resistance value of the resistive memory element R_cell of the memory block 30, and generates the storage data Data_sa.

The data comparison block 60 compares input data Data_in input from an exterior with the storage data Data_sa, and generates the first and second control signals ctrl1 and ctrl2. For example, when the input data Data_in is substantially equal to the storage data Data_sa, the data comparison block 60 disables the first and second control signals ctrl1 and ctrl2. When the input data Data_in is different from the storage data Data_sa, the data comparison block 60 enables one of the first and second control signals ctrl1 and ctrl2 in response to the input data Data_in.

Figure 3:
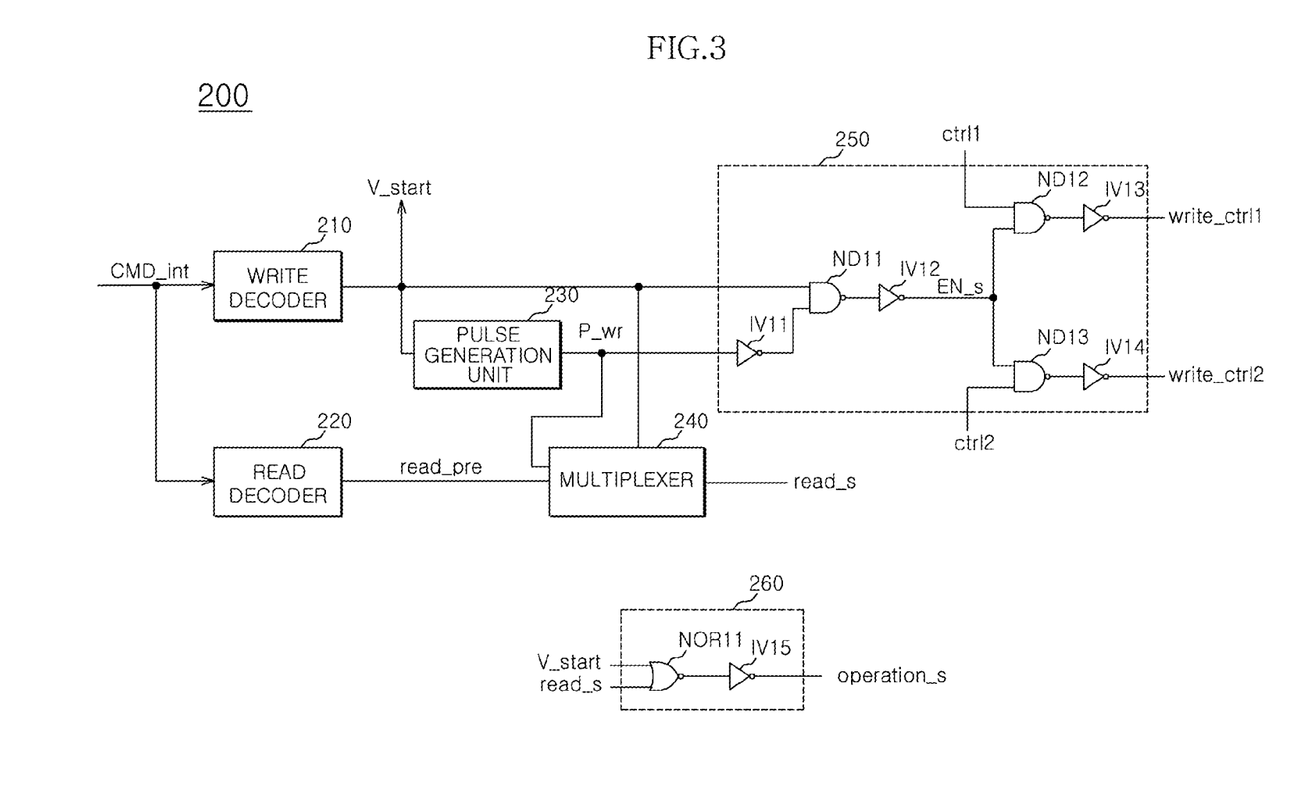
FIG. 3 is a configuration diagram of a command processing block of FIG. 2.

As illustrated in FIG. 3, the command processing block 200 may include a write decoder 210, a read decoder 220, a pulse generation unit 230, a multiplexer 240, a control signal generation unit 250, and an operation signal generation unit 260.

The write decoder 210 decodes the internal command CMD_int, and enables the voltage generation start signal V_start when the internal command CMD_int is the write command.

The read decoder 220 decodes the internal command CMD_int, and enables a preliminary read signal read_pre when the internal command CMD_int is the read command.

The pulse generation unit 230 generates a write pulse P_wr in response to the voltage generation start signal V_start. For example, the pulse generation unit 230 is enabled when the voltage generation start signal V_start is enabled, and generates the write pulse P_wr that substantially maintains an enabled state for a predetermined time.

The multiplexer 240 outputs one of the preliminary read signal read_pre and the write pulse P_wr as the read signal read_s in response to the voltage generation start signal V_start. For example, the multiplexer 240 outputs the write pulse P_wr as the read signal read_s when the voltage generation start signal V_start is enabled, and outputs the preliminary read signal read_pre as the read signal read_s when the voltage generation start signal V_start is disabled. That is, since the voltage generation start signal V_start is enabled in a write operation, the multiplexer 240 outputs and the write pulse P_wr as the read signal read_s in the write operation, and outputs the preliminary read signal read_pre as the read signal read_s in a read operation other than the write operation.

The control signal generation unit 250 generates the first and second write control signals write_ctrl1 and write_ctrl2 in response to the voltage generation start signal V_start, the write pulse P_wr, and the first and second control signals ctrl1 and ctrl2. For example, when the first control signal ctrl1 is enabled in the period in which the voltage generation start signal V_start has been enabled and the write pulse P_wr has been disabled, the control signal generation unit 250 enables the first write control signal write_ctrl1. When the second control signal ctrl2 is enabled in the period in which the voltage generation start signal V_start has been enabled and the write pulse P_wr has been disabled, the control signal generation unit 250 enables the second write control signal write_ctrl2.

The control signal generation unit 250 may include first to fourth inverters IV11 to IV14 and first to third NAND gates ND11 to ND13. The first inverter IV11 receives the write pulse P_wr. The first NAND gate ND11 receives the voltage generation start signal V_start and an output signal of the first inverter IV11. The second inverter IV12 receives an output signal of the first NAND gate ND11 and outputs an enable signal EN_s. The second NAND gate ND12 receives the enable signal EN_s and the first control signal ctrl1. The third inverter IV13 receives an output signal of the second NAND gate ND12 and outputs the first write control signal write_ctrl1. The third NAND gate ND13 receives the enable signal EN_s and the second control signal ctrl2. The fourth inverter IV14 receives an output signal of the third NAND gate ND13 and outputs the second write control signal write_ctrl2.

The operation signal generation unit 260 generates the operation signal operation_s in response to the voltage generation start signal V_start and the read signal read_s. For example, when one of the voltage generation start signal V_start and the read signal read_s is enabled, the operation signal generation unit 260 enables the operation signal operation_s.

The operation signal generation unit 260 may include a NOR gate NOR11 and a fifth inverter IV15. The NOR gate NOR11 receives the voltage generation start signal V_start and the read signal read_s. The fifth inverter IV15 receives an output signal of the NOR gate NOR11, and outputs the operation signal operation_s.

The semiconductor memory apparatus configured as above according to the embodiments operates as follows.

Referring to FIG. 2, the external command CMD_ext is converted to the internal command CMD_int in the command input block 10.

The internal command CMD_int is input to the command processing block 200. Hereinafter, a description will be provided for the case in which the internal command CMD_int is a read command.

Referring to FIG. 3, when the internal command CMD_int is the read command, the write decoder 210 disables the voltage generation start signal V_start and the read decoder 220 enables the preliminary read signal read_pre.

When the voltage generation start signal V_start is disabled, the multiplexer 240 outputs the preliminary read signal read_pre as the read signal read_s.

When the read signal read_s is enabled, the operation signal generation unit 260 enables the operation signal operation_s. When the read signal read_s is disabled, the operation signal generation unit 260 disables the operation signal operation_s.

Figure 4:
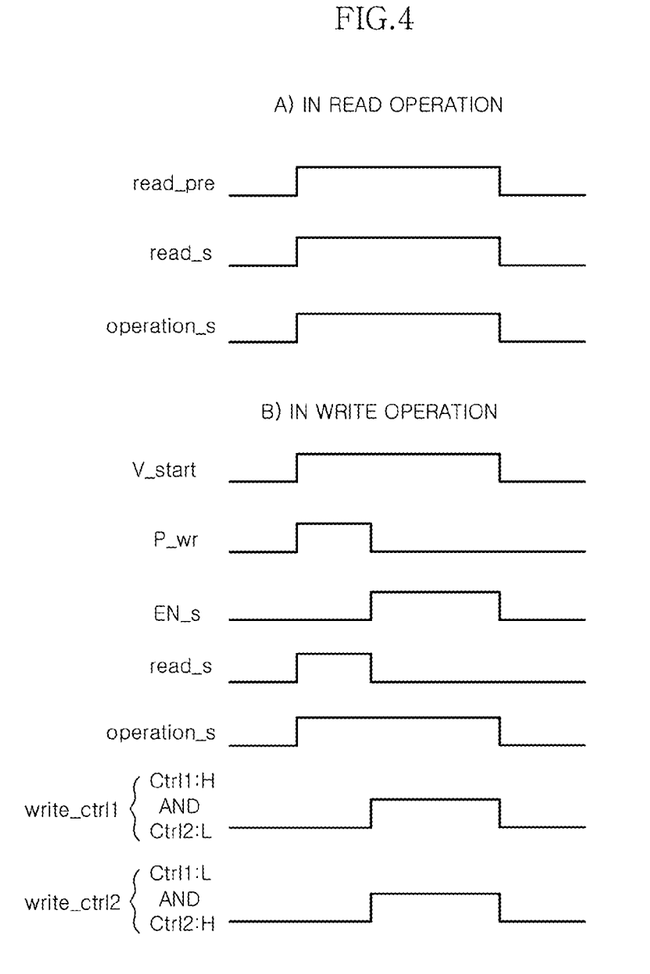
FIG. 4 is a timing diagram of a semiconductor memory apparatus according to an embodiment.

Referring to FIG. 4, in the read operation (see A) IN READ OPERATION), the preliminary read signal read_pre is output as the read signal read_s and the operation signal operation_s.

Referring to FIG. 2, in the read operation, when the read signal read_s and the operation signal operation_s are enabled, the memory block 30 and the sense amplifier 50 are electrically coupled to each other through the first and second switches 420 and 430.

In response to the enabled read signal read_s, the sense amplifier 50 is activated to determine data stored in the memory block 30, and outputs the storage data Data_sa. In the read operation, the storage data Data_sa generated in the sense amplifier 50 is output to an exterior of the semiconductor memory apparatus through a data output circuit (not illustrated).

Hereinafter, a description will be provided for an operation of the semiconductor memory apparatus according to the embodiments when the internal command CMD_int indicates a write operation.

Referring to FIG. 3, when the internal command CMD_int indicates the write operation, the write decoder 210 enables the voltage generation start signal V_start. In the write operation, the read decoder 220 disables the preliminary read signal read_pre.

When the voltage generation start signal V_start is enabled, the pulse generation unit 230 generates the write pulse P_wr that is enabled for a predetermined time.

When the voltage generation start signal V_start is enabled, the multiplexer 240 outputs the write pulse P_wr as the read signal read_s.

The control signal generation unit 250 generates the enable signal EN_s that is enabled in the period in which the voltage generation start signal V_start has been enabled and the write pulse P_wr has been disabled. When the enable signal EN_s is enabled, the control signal generation unit 250 disables the first and second write control signals write_ctrl1 and write_ctrl2 or enables one of the first and second write control signals write_ctrl1 and write_ctrl2 in response to the first and second control signals ctrl1 and ctrl2. For example, when the first and second control signals ctrl1 and ctrl2 are disabled in the period in which the enable signal EN_s has been enabled, the control signal generation unit 250 disables the first and second write control signals write_ctrl1 and write_ctrl2. When the first control signal ctrl1 is enabled in the period in which the enable signal EN_s has been enabled, the control signal generation unit 250 enables the first write control signal write_ctrl1. When the second control signal ctrl2 is enabled in the period in which the enable signal EN_s has been enabled, the control signal generation unit 250 enables the second write control signal write_ctrl2.

When one of the voltage generation start signal V_start and the read signal read_s is enabled, the operation signal generation unit 260 generates the enabled operation signal operation_s.

With reference to FIG. 2 and FIG. 4, the write operation of the semiconductor memory apparatus according to the embodiments will be described.

In the write operation (see B) IN WRITE OPERATION), the voltage generation start signal V_start is enabled.

When the voltage generation start signal V_start is enabled, the first and second voltage supply parts 411-1 and 411-2 for writing generate the first and second voltages V_set and V_reset for writing, respectively.

The first and second transistors P11 and P12 for voltage generation generate the first and second memory voltages V_wr1 and V_wr2 having voltage levels corresponding to the voltage levels of the first and second voltages V_set and V_reset for writing.

When the voltage generation start signal V_start is enabled, the write pulse P_wr is enabled for a predetermined time. The write pulse P_wr is output as the read signal read_s. In the write operation, the operation signal operation_s has a phase substantially equal to that of the voltage generation start signal V_start.

In the period in which the read signal read_s and the operation signal operation_s have been enabled, the sense amplifier 50 is activated and is electrically coupled to the memory block 30 through the first and second switches 420 and 430. At this time, the sense amplifier 50 determines data stored in the memory block 30 and generates the storage data Data_sa. The data comparison block 60 compares the input data Data_in input from an exterior with the storage data Data_sa, and generates the first and second control signals ctrl1 and ctrl2. When the input data Data_in is substantially equal to the storage data Data_sa, the data comparison block 60 disables the first and second control signals ctrl1 and ctrl2. When the input data Data_in is different from the storage data Data_sa, the data comparison block 60 enables one of the first and second control signals ctrl1 and ctrl2 according to the data value of the input data Data_in.

As described above, in the write operation, in the period in which the read signal read_s and the operation signal operation_s have been enabled, whether to enable the first and second control signals ctrl1 and ctrl2 is decided according to a result obtained by comparing the input data Data_in with the storage data Data_sa.

In the period in which the voltage generation start signal V_start has been enabled and the write pulse P_wr has been disabled, that is, in the period in which the enable signal EN_s has been enabled, when the first control signal ctrl1 of the first and second control signals ctrl1 and ctrl2 is enabled, the first write control signal write_ctrl1 is enabled (i.e., Ctrl1:H AND Ctrl2:L). Furthermore, in the period in which the enable signal EN_s has been enabled, when the second control signal ctrl2 of the first and second control signals ctrl1 and ctrl2 is enabled, the second write control signal write_ctrl2 is enabled (i.e., CTRl1 AND Ctrl2:H).

In the period in which the operation signal operation_s and the first write control signal write_ctrl1 have been enabled, the first memory voltage V_wr1 is applied to the memory block 30 through the first switch 420 and the third switch 411-2. In the period in which the operation signal operation_s and the second write control signal write_ctrl2 have been enabled, the second memory voltage V_wr2 is applied to the memory block 30 through the first switch 420 and the fourth switch 412-2.

As described above, in the write operation, when the storage data Data_sa is different from the input data Data_in, one of the first and second memory voltages V_wr1 and V_wr2 is applied to the memory block 30 according to the input data Data_in. When one of the first and second memory voltages V_wr1 and V_wr2 is applied to the memory block 30, the memory block 30 stores data according to a level of the applied voltage.

In the write operation, when the storage data Data_sa is substantially equal to the input data Data_in, since the first and second write control signals write_ctrl1 and write_ctrl2 are disabled and the memory block 30 does not receive the first and second memory voltages V_wr1 and V_wr2, the memory block 30 substantially maintains stored data as is.

The general semiconductor memory apparatus starts to generate the first memory voltage or the second memory voltage according to a result obtained by comparing the input data with the storage data in the write operation as illustrated in FIG. 1. That is, in the general semiconductor memory apparatus, since the memory voltages reach preset voltage levels and then are applied to the memory block in the write operation, a time is required until the memory voltages reach the preset voltage levels.

However, in the semiconductor memory apparatus according to the embodiments, it is possible to start generate the memory voltages simultaneously to the write operation, and to selectively apply the generated memory voltages, that is, the memory voltages having reached the preset voltage levels, to the memory block according to a result obtained by comparing the input data with the storage data. Consequently, in the semiconductor memory apparatus according to the embodiments, it is possible to improve a write operation speed as compared with the general semiconductor memory apparatus.

While certain embodiments have been described above, it will be understood to those skilled in the art that the embodiments described are by way of example only. Accordingly, the semiconductor memory apparatus and the operation method using the same described herein should not be limited based on the described embodiments. Rather, the semiconductor memory apparatus and the operation method using the same described herein should only be limited in light of the claims that follow when taken in conjunction with the above description and accompanying drawings.

What is claimed is:

1. A semiconductor memory apparatus comprising:
    a command processing block configured to generate a voltage generation start signal, a first write control signal, a second write control signal, a read signal, and an operation signal in response to a first control signal and a second control signal in a write operation; and
    a memory control block configured to electrically couple a memory block, which stores data, to a sense amplifier or apply a predetermined voltage to the memory block in response to the voltage generation start signal, the first write control signal, the second write control signal, the read signal, and the operation signal.

2. The semiconductor memory apparatus according to claim 1, wherein the command processing block enables the read signal and the operation signal in response to an internal command signal in a read operation.

3. The semiconductor memory apparatus according to claim 2, wherein, in the write operation, the command processing block enables the voltage generation start signal in response to the internal command signal, generates the read signal that is enabled for a predetermined time when the voltage generation start signal is enabled, and selectively enables the first and second write control signals in response to the first and second control signals when the read signal is disabled,
    in the read operation, the command processing block enables the read signal in response to the internal command signal, and
    when one of the voltage generation start signal and the read signal is enabled, the command processing block enables the operation signal.

4. The semiconductor memory apparatus according to claim 3, wherein, when the read signal and the operation signal are enabled, the memory control block electrically couples the memory block to the sense amplifier, and when the voltage generation start signal is enabled, the memory control block starts to generate a voltage to be supplied to the memory block, and applies the voltage having a predetermined voltage level to the memory block in response to the first and second write control signals and the operation signal.

5. The semiconductor memory apparatus according to claim 4, wherein the memory control block comprises:

a first switch configured to electrically couple the memory block to a common node in response to the operation signal;

a second switch configured to electrically couple the common node to the sense amplifier in response to the read signal; and a voltage supply unit configured to start voltage generation in response to the voltage generation start signal, and apply the predetermined voltage to the common node in response to the first and second write control signals.

6. The semiconductor memory apparatus according to claim 5, wherein the voltage supply unit comprises:

a first memory voltage applying section configured to generate a first voltage for writing when the voltage generation start signal is enabled, and apply a first memory voltage corresponding to a voltage level of the first voltage for writing to the common node in response to the first write control signal; and a second memory voltage applying section configured to generate a second voltage for writing when the voltage generation start signal is enabled, and apply a second memory voltage corresponding to a voltage level of the second voltage for writing to the common node in response to the second write control signal.

7. The semiconductor memory apparatus according to claim 6, wherein the voltage generation start signal has a phase substantially equal to that of the voltage generation start signal in the write operation.

8. The semiconductor memory apparatus according to claim 6, wherein the first memory voltage applying section comprises:

a voltage supply section for writing configured to be activated when the voltage generation start signal is enabled, and generate the first voltage for writing;

a transistor for voltage generation configured to generate the first memory voltage in correspondence with a voltage level of the first voltage for writing; and a third switch configured to apply the first memory voltage to the common node in response to the first write control signal.

9. The semiconductor memory apparatus according to claim 8, wherein the transistor for voltage generation receives the first voltage for writing through a gate thereof, receives a driving voltage through a source thereof, and outputs the first memory voltage through a drain thereof.

10. The semiconductor memory apparatus according to claim 9, wherein the first voltage has a voltage level substantially equal to a voltage level of the first memory voltage.

11. The semiconductor memory apparatus according to claim 6, wherein the second memory voltage applying section comprises:

a voltage supply section for writing configured to be activated when the voltage generation start signal is enabled, and generate the second voltage for writing;

a transistor for voltage generation configured to generate the second memory voltage in correspondence with a voltage level of the second voltage for writing; and a third switch configured to apply the second memory voltage to the common node in response to the second write control signal.

12. The semiconductor memory apparatus according to claim 11, wherein the transistor for voltage generation receives the second voltage for writing through a gate thereof, receives a driving voltage through a source thereof, and outputs the second memory voltage through a drain thereof.

13. The semiconductor memory apparatus according to claim 12, wherein the second voltage has a voltage level substantially equal to a voltage level of the second memory voltage.

14. The semiconductor memory apparatus according to claim 1, wherein the sense amplifier is activated in response to the read signal, and generates storage data in response to data stored in the memory block.

15. The semiconductor memory apparatus according to claim 14, further comprising:

a data comparison block configured to compare input data input from an exterior with the storage data, and generate the first and second control signals.

16. The semiconductor memory apparatus according to claim 15, wherein the data comparison block disables the first and second control signals when the input data is substantially equal to the storage data, and enables one of the first and second control signals in response to the input data when the input data is different from the storage data.

17. The semiconductor memory apparatus according to claim 3, wherein the command processing block includes:

a write decoder configured for decoding the internal command signal and enabling the voltage generation start signal;

a read decoder configured for decoding the internal command signal and enabling a preliminary read signal;

a pulse generation unit configured for generating a write pulse in response to the voltage generation start signal;

a multiplexer configured for outputting one of the preliminary read signal and the write pulse as the read signal;

a control signal generation unit configured for generating the first and second write control signals in response to the voltage generation start signal, the write pulse and the first and second control signals; and an operation signal generation unit configured for generating the operation signal in response to the voltage generation start signal and the read signal.

18. A semiconductor memory apparatus comprising:

a memory block configured to store data according to a voltage level of a memory voltage;

a voltage supply unit configured to generate the memory voltage when an external command is a write command, and apply the memory voltage to the memory block in response to a control signal; and a data comparison block configured to compare data input from an exterior with storage data, and generate the control signal.

19. The semiconductor memory apparatus according to claim 18, further comprising:

a sense amplifier configured to determine a data value of the memory block and generate the storage data when the external command is the write command.

20. The semiconductor memory apparatus according to claim 19, wherein, when the external command is the write command, the voltage supply unit generates the memory voltage and simultaneously the sense amplifier compares the input data with the storage data.

21. The semiconductor memory apparatus according to claim 20, wherein the data comparison block disables the control signal when the input data is substantially equal to the storage data, and enables the control signal when the input data is different from the storage data, and the voltage supply unit applies the memory voltage to the memory block when the control signal is enabled, and does not apply the memory voltage to the memory block when the control signal is disabled.

22. An operation method of a semiconductor memory apparatus, comprising:

a step of comparing stored data with input data to generate a control signal and simultaneously generating a memory voltage in a write operation; and a step of applying the memory voltage to the memory block in response to the control signal, and storing data in the memory block.

23. The operation method according to claim 22, wherein the step of comparing the stored data with the input data to generate the control signal and simultaneously generating the memory voltage in the write operation comprises:

a step of electrically coupling the memory block to a sense amplifier and simultaneously generating the memory voltage; and a step of determining, by the sense amplifier, data of the memory block, comparing a determined result with the input data, and generating the control signal.

24. The operation method according to claim 23, wherein the step of determining, by the sense amplifier, the data of the memory block, comparing the determined result with the input data, and generating the control signal comprises:

a step of disabling the control signal when the determined result in the sense amplifier is substantially equal to the input data; and a step of enabling the control signal when the determined result in the sense amplifier is different from the input data.

\* \* \* \* \*